United States Patent
Umeda et al.

(10) Patent No.: US 11,370,926 B2
(45) Date of Patent: Jun. 28, 2022

(54) CONDUCTIVE COATING MATERIAL AND PRODUCTION METHOD FOR SHIELDED PACKAGE USING CONDUCTIVE COATING MATERIAL

(71) Applicant: TATSUTA ELECTRIC WIRE & CABLE CO., LTD., Higashiosaka (JP)

(72) Inventors: Hiroaki Umeda, Kizugawa (JP); Kazuhiro Matsuda, Kizugawa (JP); Ken Yukawa, Kizugawa (JP)

(73) Assignee: TATSUTA ELECTRIC WIRE & CABLE CO., LTD., Higashiosaka (JP)

( * ) Notice: Subject to any disclaimer, the term of this patent is extended or adjusted under 35 U.S.C. 154(b) by 947 days.

(21) Appl. No.: 16/088,163

(22) PCT Filed: Mar. 27, 2017

(86) PCT No.: PCT/JP2017/012385
§ 371 (c)(1),
(2) Date: Sep. 25, 2018

(87) PCT Pub. No.: WO2017/170398
PCT Pub. Date: Oct. 5, 2017

(65) Prior Publication Data
US 2020/0299523 A1 Sep. 24, 2020

(30) Foreign Application Priority Data
Mar. 29, 2016 (JP) .............................. JP2016-065470

(51) Int. Cl.
*C09D 5/24* (2006.01)
*C09D 7/40* (2018.01)
(Continued)

(52) U.S. Cl.
CPC ................. *C09D 5/24* (2013.01); *C09D 4/06* (2013.01); *C09D 7/70* (2018.01); *C09D 133/10* (2013.01);
(Continued)

(58) Field of Classification Search
CPC ... C09D 4/06; C09D 5/24; C09D 7/70; C09D 133/10; C09D 163/00; H05K 3/0097;
(Continued)

(56) References Cited

U.S. PATENT DOCUMENTS 4,695,404 A * 9/1987 Kwong ................ H02G 15/105
524/439
5,928,570 A * 7/1999 Reo .......................... H01B 1/22
252/514
(Continued)

FOREIGN PATENT DOCUMENTS

CN          1745437 A        3/2006
CN       104981138 A   *   10/2014
(Continued)

OTHER PUBLICATIONS

International Search Report dated Jun. 6, 2017, issued in counterpart application No. PCT/JP2017/012385 (3 pages).
(Continued)

*Primary Examiner* — Carl J Arbes
(74) *Attorney, Agent, or Firm* — WHDA, LLP

(57) ABSTRACT

A conductive coating material is disclosed including at least (A) 100 parts by mass of a binder component including 5 to 30 parts by mass of solid epoxy resin that is solid at normal temperature and 20 to 90 parts by mass of liquid epoxy resin that is liquid at normal temperature, (B) 200 to 1800 parts by mass of silver-coated copper alloy particles in which the copper alloy particles are made of an alloy of copper, nickel, and zinc, the silver-coated copper alloy particles have a
(Continued)

nickel content of 0.5% to 20% by mass, and the silver-coated copper alloy particles have a zinc content of 1% to 20% by mass with respect to 100 parts by mass of the binder component (A), and (C) 0.3 to 40 parts by mass of a curing agent with respect to 100 parts by mass of the binder component (A).

16 Claims, 3 Drawing Sheets

(51) Int. Cl.
      *C09D 4/06*       (2006.01)
      *C09D 133/10*       (2006.01)
      *C09D 163/00*       (2006.01)
      *H05K 3/00*       (2006.01)
      *H05K 3/28*       (2006.01)
      *H05K 3/30*       (2006.01)
      *H05K 9/00*       (2006.01)

(52) U.S. Cl.
      CPC .......... *C09D 163/00* (2013.01); *H05K 3/0097* (2013.01); *H05K 3/285* (2013.01); *H05K 3/303* (2013.01); *H05K 9/0083* (2013.01); *H05K 2203/1316* (2013.01); *H05K 2203/1327* (2013.01)

(58) Field of Classification Search
      CPC ...... H05K 3/285; H05K 3/303; H05K 9/0083; H05K 2203/1316; H05K 2203/1327
      See application file for complete search history.

(56) References Cited

U.S. PATENT DOCUMENTS

| | | |
|---|---|---|
| 2003/0160313 A1 | 8/2003 | Ichihashi et al. |
| 2006/0145125 A1 | 7/2006 | Kuwajima et al. |
| 2014/0326929 A1 | 11/2014 | Hsueh et al. |
| 2015/0171020 A1 | 6/2015 | Shibuya et al. |

FOREIGN PATENT DOCUMENTS

| | | | |
|---|---|---|---|
| JP | 03-008389 B | * | 2/1991 |
| JP | 04268381 A | * | 9/1992 |
| JP | 11097883 A | * | 4/1999 |
| JP | 2003-258137 A | | 9/2003 |
| JP | 2004-47174 A | | 2/2004 |
| JP | 2004-55543 A | | 2/2004 |
| JP | 2008-42152 A | | 2/2008 |
| JP | 2011-151372 A | | 8/2011 |
| JP | 2014-220238 A | | 11/2014 |
| JP | 2015-21143 A | | 2/2015 |
| JP | 2015-21145 A | | 2/2015 |
| JP | 2015-115549 A | | 6/2015 |
| WO | 98/20719 | * | 5/1998 |

OTHER PUBLICATIONS

Office Action dated Sep. 17, 2020, issued in counterpart CN Application No. 201780019574.5, with English translation (17 pages).
Office Action dated Jun. 9, 2021, issued in counterpart KR Application No. 10-2018-7029249, with machine translation. (10 pages).
Office Action dated Mar. 24, 2020, issued in counterpart CN application No. 201780019574.5, with English translation. (14 pages).

* cited by examiner

CONDUCTIVE COATING MATERIAL AND PRODUCTION METHOD FOR SHIELDED PACKAGE USING CONDUCTIVE COATING MATERIAL

TECHNICAL FIELD

The present invention relates to a conductive coating material and a production method for a shielded package using the conductive coating material.

BACKGROUND ART

In recent years, in electronic devices such as portable telephones and tablet terminals, a lot of electronic parts for wireless communication to transmit high-volume data have been mounted. Such electronic parts for wireless communication have a problem in that the electronic parts not only easily generate noises but also are highly sensitive to noises, and, when exposed to noises from outside, the electronic parts are easily caused to carry out erroneous operations.

Meanwhile, in order to obtain miniaturization and weight reduction as well as high functions of electronic devices, it is required to increase mounting density of electronic parts. However, when the mounting density is increased, there occurs a problem in that not only electronic parts as sources for generating noises are increased but also electronic parts affected by the noises are increased.

In the related art, as means for solving the problem, a so-called shielded package that prevents generation of noises from an electronic part and prevents penetration of noises by covering the electronic part which is a source of generating noises with a shield layer for each package is known. For example, PTL 1 discloses that it is possible to easily obtain an electromagnetic shielded member with a high shielding effect by spraying a conductive or semi-conductive material on a surface of a package to coat it. However, in a case where a shield layer is formed by spray coating using a solution made of metal particles and a solvent, there is a problem in that favorable shielding properties are not obtained and adhesion between the shield layer and a package deteriorates.

In addition, as means for efficiently preparing a shielded package, for example, as disclosed in PTL 2, a method of preparing a circuit module is known that includes a step of covering a plurality of ICs with an insulating layer, a step of covering the insulating layer with a shield layer made of a conductive paste, and a step of dividing a substrate in which the shield layer is formed (method of preliminarily forming a cut groove, of which a tip end portion has a smaller width than that of a base end portion in a depth direction, on the insulating layer before forming a shield layer for covering the insulating layer, forming a shield layer by applying a conductive resin to be filled in the cut groove, and then dividing a substrate by cutting away thereof with a width that is larger than the width of the tip end portion and smaller than the width of the base end portion along the tip end portion of the cut groove). As disclosed in the document, examples of a method for forming a shield layer include a transfer mold method or potting method, a vacuum printing method, and the like. However, all of these methods require large-scale equipment and have a problem in that it is easy to entrain bubbles when a conductive resin is filled in a groove portion.

In addition, when a shielded package in the related art is introduced into a solder reflow process, there occurs a problem in that a color tone of a shield layer is changed and thus it is hard to obtain a preferable appearance. With respect to this, if a shield layer is formed by using high-purity silver particles, discoloration may be suppressed. However, since the cost is high, such a shield layer lacks general usability.

CITATION LIST

Patent Literature

[PTL 1] JP-A-2003-258137
[PTL 2] JP-A-2008-42152

SUMMARY OF INVENTION

Technical Problem

The present invention is made in view of the above matters, and an object of the present invention is to provide a conductive coating material that may be used to form a shield layer having favorable shielding properties by spray coating at a low cost, in which the obtained shield layer has favorable adhesion to a package and is hardly discolored even in a severe heating condition. In addition, another object of the present invention is to provide a production method for a shielded package in which the above-described shield layer may be easily formed.

Solution to Problem

In view of the above matters, a conductive coating material of the present invention includes at least (A) 100 parts by mass of a binder component including 5 to 35 parts by mass of a solid epoxy resin that is a solid at normal temperature and 20 to 90 parts by mass of a liquid epoxy resin that is a liquid at normal temperature, provided that the total amount of the solid and liquid epoxy resins does not exceed 100 parts by mass, (B) 200 to 1800 parts by mass of silver-coated copper alloy particles which are copper alloy particles covered with a silver-containing layer, in which the copper alloy particles are made of an alloy of copper, nickel, and zinc, the silver-coated copper alloy particles have a nickel content of 0.5% to 20% by mass, and the silver-coated copper alloy particles have a zinc content of 1% to 20% by mass with respect to 100 parts by mass of the binder component (A), and (C) 0.3 to 40 parts by mass of a curing agent with respect to 100 parts by mass of the binder component (A).

The liquid epoxy resin preferably contains 5 to 35 parts by mass of a liquid glycidyl amine type epoxy resin and 20 to 55 parts by mass of a liquid glycidyl ether type epoxy resin, provided that the total amount of the epoxy resins does not exceed 90 parts by mass.

The liquid glycidyl amine type epoxy resin preferably has a weight per epoxy equivalent of 80 to 120 g/eq and a viscosity of 1.5 Pa·s or less, and the liquid glycidyl ether type epoxy resin preferably has a weight per epoxy equivalent of 180 to 220 g/eq and a viscosity of 6 Pa·s or less.

In the conductive coating material, the binder component (A) may further contain a (meth)acrylate compound.

In addition, the silver-coated copper alloy particles (B) may be flake shape.

The conductive coating material is suitable for use in shielding an electronic part package.

According to the present invention, there is provided a method for producing a shielded package in which electronic parts are mounted on a substrate, and a package obtained by sealing the electronic parts with a sealing material is covered with a shield layer, the method including at least a step of mounting a plurality of electronic parts on a substrate and sealing the electronic parts by filling the substrate with a sealing material and curing thereof, a step of forming a groove portion by cutting away the sealing material between the plurality of electronic parts and individualizing a package of each electronic part on the substrate by the groove portion, a step of applying the conductive coating material of the present invention to a surface of the individualized package by spraying, a step of forming a shield layer by heating a package to which the conductive coating material is applied and curing the conductive coating material, and a step of obtaining a fragmented shielded package by cutting the substrate along the groove portion.

Advantageous Effects of Invention

According to the conductive coating material of the present invention, it is possible to form a coating film having a uniform thickness by a spray method and to suppress discoloration of the obtained coating film even in a severe heating condition. Therefore, by spray coating the conductive coating material of the present invention on a surface of a package, it is possible to easily form a shield layer having an excellent shielding effect and an excellent appearance as well as excellent adhesion to the package.

In addition, according to the production method for a shielded package of the present invention, it is possible to efficiently produce a shielded package having excellent shielding properties, discoloration resistance, and adhesion to the package as described above without using large-scale equipment.

REFERENCE SINGS LIST

Figure 1A:
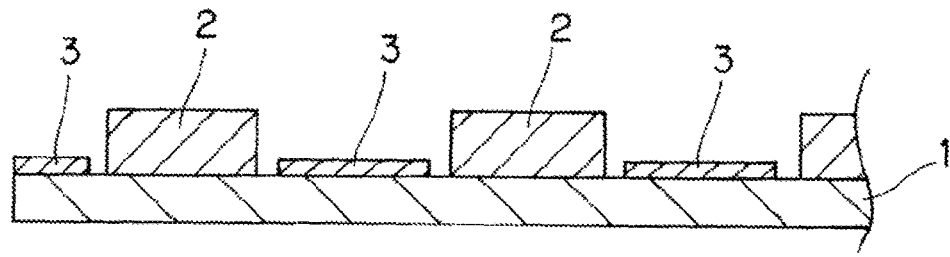
FIGS. 1(a) to 1(e) show perspective sectional views illustrating an embodiment of a production method for a shielded package.

A individualized package on a substrate
B fragmented shielded package
$B_1$, $B_2$, $B_9$ shielded package before fragmentation
C chip sample
1 substrate
2 electronic parts
3 Ground circuit pattern (copper foil)
4 sealing material
5 shield layer (conductive coating film)
11 to 19 groove

DESCRIPTION OF EMBODIMENTS

As described above, a conductive coating material according to the present invention contains at least (A) 100 parts by mass of a thermosetting epoxy resin, (B) 200 to 1800 parts by mass of silver-coated copper alloy particles obtained by covering copper alloy particles with a silver-containing layer, in which copper alloy particles are formed of an alloy of copper, nickel, and zinc, the content of nickel is 0.5% to 20% by mass in the silver-coated copper alloy particles, and the content of zinc is 1% to 20% by mass in the silver-coated copper alloy particles with respect to 100 parts by mass of the thermosetting epoxy resin (A), and (C) 0.3 to 40 parts by mass of a curing agent with respect to 100 parts by mass of the thermosetting epoxy resin (A). The use of the conductive coating material is not particularly limited, but is suitable for use in obtaining a shielded package by spraying the conductive coating material in a vapor state by a spray and the like and forming the shield layer on a surface of a package before fragmentation or a fragmented package.

Silver-coated copper alloy particles in the conductive coating material of the present invention contain copper alloy particles and a silver-containing layer covering the copper alloy particles. The copper alloy particles contain nickel and zinc in the above-described range, and the remainder is copper. The remaining copper may contain unavoidable impurities. By using the copper alloy particles having such a silver-coated layer, it is possible to obtain a shielded package having excellent shielding properties.

Since the content of nickel in the silver-coated copper alloy particles is 0.5% to 20% by mass and the content of zinc is 1% to 20% by mass, it is possible to suppress discoloration of a shield layer even in a severe heating condition, for example, it is possible to suppress discoloration of a shielded package after solder reflow. More specifically, the content of nickel is preferably 0.5% to 20% by mass in the silver-coated copper alloy particles, and more preferably 3% to 15% by mass in the silver-coated copper alloy particles. If the content of nickel is 0.5% by mass or greater, it is possible to suppress discoloration even in a severe heating condition. In addition, if the content of nickel is 20% by mass or less, it is possible to obtain a package having excellent shielding properties while conductivity of a coating film is favorable. The content of zinc in the silver-coated copper alloy particles is preferably 1% to 20% by mass, and more preferably 3% to 15% by mass. If the content of zinc is 1% by mass or greater, adhesion to silver is improved and thus conductivity is further increased, and if the content of zinc is 20% by mass or less, conductivity of alloy powders becomes favorable and thus conductivity of the conductive coating material also becomes favorable.

A ratio of a silver coating amount in the silver-coated copper alloy particles is preferably 3% to 30% by mass, and more preferably 5% to 20% by mass. If the silver coating amount is 3% by mass or greater, it is easy to suppress discoloration of a shielded package even in a severe heating condition, and it is possible to obtain favorable conductivity. If the silver coating amount is 30% by mass or less, it is possible to obtain a shielded package having excellent shielding properties at low cost.

Examples of the shape of the silver-coated copper alloy particles include flake shape (scale shape), dendrite shape, spherical shape, fiber shape, amorphous shape (polyhedron), and the like, but from a viewpoint of obtaining a shield layer having a lower resistance value and further improved shielding properties, flake shape is preferable.

The content of the silver-coated copper alloy particles is preferably 200 to 1800 parts by mass with respect to 100 parts by mass of the binder component. If the content is 200 parts by mass or greater, conductivity of the shield layer becomes favorable, and if the content is 1800 parts by mass or less, adhesion between the shield layer and the package as well as physical properties of the conductive coating material after curing become favorable and chipping of the shield layer when performing cutting with a dicing saw to be described later is hardly likely to occur.

In addition, an average particle diameter of the silver-coated copper alloy particles is preferably 1 to 30 μm. If the average particle diameter of the silver-coated copper alloy particles is 1 μm or greater, dispersibility of the silver-coated copper alloy particles is favorable and thus coagulation can be prevented, and oxidation is hardly likely to occur. If the average particle diameter of the silver-coated copper alloy particles is 30 μm or less, connectivity of the package to a ground circuit is favorable.

In addition, in a case where the silver-coated copper alloy particles are flake shape, a tap density of the silver-coated copper alloy particles is preferably 4.0 to 6.5 g/cm$^3$. If the tap density is in the above-described range, conductivity of the shield layer becomes more favorable.

In addition, in the case where the silver-coated copper alloy particles are flake shape, an aspect ratio of the silver-coated copper alloy particles is preferably 2 to 10. If the aspect ratio is in the above-described range, conductivity of a shield layer is more favorable.

The binder component in the conductive coating material of the present invention contains a thermosetting epoxy resin including an epoxy resin that is a solid at normal temperature (hereinafter, referred to as "solid epoxy resin") and an epoxy resin that is a liquid at normal temperature (hereinafter, referred to as "liquid epoxy resin"), and may further contain a (meth)acrylate compound depending on the necessity. By having the thermosetting epoxy resin as a binder component, it is possible for the binder component to maintain functions as a package without being softened even when exposed to a solder reflow process. In addition, by using the solid epoxy resin and the liquid epoxy resin in combination at a predetermined ratio, a coating material suitable for spray coating as described later is obtained.

Here, regarding the epoxy resin, "solid at normal temperature" means a state of not having fluidity in a non-solvent state at 25° C., and "liquid at normal temperature" means a state having fluidity in the same condition. The solid epoxy resin is preferably 5 to 30 parts by mass in 100 parts by mass of the binder component, and more preferably 5 to 20 parts by mass. In addition, the liquid epoxy resin is preferably 20 to 90 parts by mass in 100 parts by mass of the binder component, and more preferably 25 to 80 parts by mass.

By using the epoxy resin that is a solid at normal temperature, a conductive coating material capable of being uniformly applied to the surface of a package and forming a shield layer without any irregularity is obtained. The solid epoxy resin preferably has two or more glycidyl groups in a molecule and has a weight per epoxy equivalent of 150 to 280 g/eq. If the weight per epoxy equivalent is 150 g/eq or greater, defects such as cracks or warping are less likely to occur, and if the weight per epoxy equivalent is 280 g/eq or less, a coating film having excellent heat resistance is easily obtained.

The solid epoxy resin can be used by being dissolved in a solvent. The solvent to be used is not particularly limited and can be appropriately selected from those to be described later.

Specific examples of the solid epoxy resin are not particularly limited, but listed are bisphenol type epoxy resins such as bisphenol A type epoxy resin, bisphenol F type epoxy resin, and bisphenol S type epoxy resin, spiro ring type epoxy resin, naphthalene type epoxy resin, biphenyl type epoxy resin, terpene type epoxy resin, glycidyl ether type epoxy resin such as tris (glycidyloxyphenyl) methan and tetrakis (glycidyloxyphenyl) ethane, glycidyl amine type epoxy resins such as tetraglycidyl diaminodiphenyl-methane, tetrabrome bisphenol A type epoxy resin, novolac type epoxy resins such as cresol novolac type epoxy resin, phenol novolac type epoxy resin, t-naphthol novolac type epoxy resin, and brominated phenol novolac type epoxy resin, and rubber-modified epoxy resins. One type of these can be used alone, or two types of these can be used in combination.

The epoxy resin that is a liquid at normal temperature is used in an amount of 20 to 90 parts by mass in 100 parts by mass of the binder component as described above. Among the amount, 5 to 35 parts by mass is preferably the liquid glycidyl amine type epoxy resin, and 20 to 55 parts by mass is preferably the liquid glycidyl ether type epoxy resin. In a case where the liquid glycidyl amine type epoxy resin and the liquid glycidyl ether type epoxy resin are combined in the range of the above content ratio, conductivity and adhesion of the conductive coating material become excellent due to the balance, warping of a shielded package after curing is further decreased, and a shielded package having excellent heat resistance is obtained.

The liquid glycidyl amine type epoxy resin preferably has a weight per epoxy equivalent of 80 to 120 g/eq and a viscosity of 1.5 Pa·s or less, and more preferably has a viscosity of 0.5 to 1.5 Pa·s. The liquid glycidyl ether type epoxy resin preferably has a weight per epoxy equivalent of 180 to 220 g/eq and a viscosity of 6 Pa·s or less, and more preferably has a viscosity of 1 to 6 Pa·s. In a case of using a liquid glycidyl amine type epoxy resin and a liquid glycidyl ether type epoxy resin of which the weight per epoxy equivalent and the viscosity are in the above preferable range, warping of a shielded package after curing is further decreased and a shielded package having excellent heat resistance is obtained.

The (meth)acrylate compound that can be used in the present invention is an acrylate compound or methacrylate compound and is not particularly limited as long as the compound has an acryloyl group or methacryloyl group. Examples of the (meth)acrylate compound include isoamyl acrylate, neopentyl glycol diacrylate, trimethylolpropane triacrylate, ditrimethylolpropane tetraacrylate, 2-hydroxy-3-acryloyloxypropyl methacrylate, phenylglycidyl ether acrylate hexamethylene diisocyanate urethane prepolymer, bisphenol A diglycidyl ether acrylic acid adduct, ethylene glycol dimethacrylate, diethylene glycol dimethacrylate, and the like. One type of these can be used alone or two types of these can be used in combination.

In a case of containing a (meth)acrylate compound as described above, a content ratio thereof is preferably 5 to 95 parts by mass of 100 parts by mass of a sum amount of the epoxy resin and the (meth)acrylate compound, and more preferably 20 to 80 parts by mass of the sum amount of the epoxy resin and the (meth)acrylate compound. If the (meth)acrylate compound is 5% by mass or greater, the conductive coating material has excellent storage reliability, the conductive coating material can be cured faster. In addition, it is possible to prevent sagging of the coating material during curing. In addition, in a case where the (meth)acrylate compound is 95% by mass or less, adhesion between a package and a shield layer easily becomes favorable.

In addition to the epoxy resin and the (meth)acrylate compound, an alkyd resin, a melamine resin, a xylene resin, and the like can be added into the binder component as a modifying agent, for the purpose of improving physical properties of the conductive coating material.

A mixture ratio in a case of blending a modifying agent to the binder component is preferably 40 parts by mass or less in 100 parts by mass of the binder component, and more preferably 10 parts by mass or less in 100 parts by mass of the binder component, from a viewpoint of adhesion between the shield layer and the package.

In the present invention, a curing agent for curing the binder component is used. The curing agent is not particularly limited but examples of the curing agent include a phenol type curing agent, an imidazole type curing agent, an amine type curing agent, a cation type curing agent, a radical type curing agent, and the like. One type of the curing agent can be used alone or two types of the curing agents can be used in combination.

Examples of the phenol type curing agent include novolac phenol, a naphthol type compound, and the like.

Examples of the imidazole type curing agent include imidazole, 2-undecylimidazole, 2-heptadecylimidazole, 2-methylimidazole, 2-ethylimidazole, 2-phenylimidazole, 2-ethyl-4-methyl-imidazole, 1-cyanoethyl-2-undecyl-imidazole, and the like.

Examples of the cation type curing agent include onium type compounds such as amine salt of boron trifluoride, P-methoxy benzene diazonium hexafluorophosphate, diphenyliodonium hexafluorophosphate, triphenylsulfonium, tetra-n-butylphosphonium tetraphenylborate, tetra-n-butylphosphonium-o, o-diethyl-phosphorodithioate, and the like.

Examples of the radical type curing agent (polymerization initiator) include di-cumyl peroxide, t-butyl cumyl peroxide, t-butyl hydroperoxide, cumene hydroperoxide, and the like.

The content of a curing agent varies depending on the type of the curing agent, but, in general, is preferably 0.3 to 40 parts by mass, and more preferably 0.5 to 35 parts by mass, with respect to 100 parts by mass of a sum amount of the binder component. If the content of a curing agent is 0.3 parts by mass or greater, adhesion between a shield layer and a surface of a package and conductivity of the shield layer become favorable, and a shield layer having an excellent shielding effect is easily obtained. In addition, if the content of a curing agent is 40 parts by mass or less, storage reliability of a conductive coating material is easily improved. Moreover, in a case of using a radical type curing agent as a curing agent, the content of the radical type curing agent is preferably 0.3 to 8 parts by mass with respect to 100 parts by mass of a sum amount of the binder component. If the content of the radical type curing agent is 0.3 parts by mass or greater, adhesion between the conductive coating film and the surface of an object to be coated and conductivity of the conductive coating film become favorable, and a conductive coating film having an excellent shielding effect is easily obtained. In addition, if the content of the radical type curing agent is 8 parts by mass or less, storage reliability of a conductive coating material is improved.

The conductive coating material of the present invention can be added with known additives such as anti-foaming agent, viscosity agent, adhesive agent, filling agent, flame retardant, and coloring agent, in a range of not impairing the object of the invention.

The conductive coating material of the present invention preferably has a viscosity lower than that of a so-called conductive paste in order that the conductive coating material may be uniformly applied onto the surface of the package by spraying.

A viscosity of the conductive coating material of the present invention is preferably appropriately adjusted depending on the use or the equipment used for coating and is not particularly limited. However, a general standard is as described below. A method for measuring a viscosity is also not particularly limited, but if the conductive coating material has a low viscosity, the viscosity can be measured with a cone-plate rotary viscometer (so-called cone-plate viscometer) and if the conductive coating material has a high viscosity, the viscosity can be measured with a single cylindrical rotary viscometer (so-called B type or BH type viscometer).

In a case where the viscosity is measured with the cone-plate rotary viscometer, the viscosity measured at 0.5 rpm using a cone spindle CP40 (cone angle: 0.8°, cone semi-diameter: 24 mm) of Brookfield Engineering is preferably 100 mPa·s or greater, and more preferably 150 mPa·s or greater. If the viscosity is 100 mPa·s or greater, liquid sagging is prevented in a case where the surface to be coated is not horizontal, and thus a thin conductive coating film is easily formed without any irregularity. In a case of a viscosity around 100 mPa·s, a method of performing so-called overcoating, in which the process of forming a thin film is repeated with a small amount of application for one time, is effective in order to obtain a uniform coating film having a desired thickness. As long as the viscosity is a viscosity measurable with the cone-plate rotary viscometer, there is no problem even if the viscosity is high.

In a case where the viscosity is measured with the single cylindrical rotary viscometer, the viscosity measured at 10 rpm using Rotor No. 5 is preferably 30 dPa·s or less, and more preferably 25 dPa·s or less. If the viscosity is 30 dPa·s or less, clogging of a spray nozzle is prevented, and a conductive coating film is easily formed without any irregularity. As long as the viscosity is a viscosity measurable with the single cylindrical rotary viscometer, there is no problem even if the viscosity is low.

The viscosity of the conductive coating material varies depending on the viscosity of the binder component or the content of the silver-coated copper alloy particles, and thus a solvent can be used such that the viscosity is in the above-described range. The solvent that can be used in the present invention is not particularly limited, and examples of the solvent include methyl ethyl ketone, acetone, acetophenone, methyl cellosolve, methyl cellosolve acetate, methyl carbitol, diethylene glycol dimethyl ether, tetrahydrofuran, butyl acetate, methyl acetate, and the like. One type of the solvent can be used alone or two types of the solvents can be used in combination.

The content of the solvent is preferably appropriately adjusted depending on the use of the conductive coating material, the equipment used for coating, and the like. Therefore, the content of the solvent varies depending on the viscosity of the binder component, the content of the silver-coated copper alloy particles, and the like. However, as a standard, the content of the solvent is preferably about 20 to 600 parts by mass with respect to 100 parts by mass of the binder component.

A shield layer obtained from the conductive coating material of the present invention is excellent in adhesion to a ground circuit formed of a copper foil and the like. Specifically, since adhesion between a copper foil of the ground circuit exposed from a portion of the shielded package and the shield layer is favorable, when fragmenting the package by cutting the package after forming the shield layer by applying the conductive coating material to a surface of the shielded package, it is possible to prevent the shield layer from being exfoliated from the ground circuit due to impact at the time of cutting.

Regarding the adhesion between the conductive coating material and the copper foil, a shear strength measured based on JIS K 6850: 1999 is preferably 3.0 MPa or greater. If the shear strength is 3.0 MPa or greater, there is almost no concern that the shield layer is exfoliated from the ground circuit due to impact at the time of cutting the package before fragmentation.

In a case where a coating film formed of the conductive coating material of the present invention is used as a shield layer, a specific resistivity is preferably $2 \times 10^{-4}$ Ω·cm or less from a viewpoint of obtaining excellent shielding properties.

Subsequently, an embodiment of a method for obtaining a shielded package by using the conductive coating material of the present invention is described by using drawings.

First, as illustrated in FIG. 1(a), a plurality of electronic parts (IC and the like) 2 are mounted on a substrate 1, and a ground circuit pattern (copper foil) 3 is provided between the plurality of electronic parts 2.

Figure 1B:
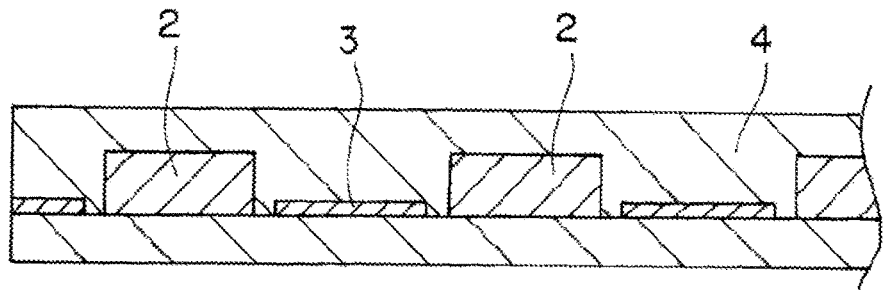

Subsequently, as illustrated in FIG. 1(b), a sealing material 4 is filled on the electronic parts 2 and the ground circuit pattern 3 and cured to seal the electronic parts 2.

Figure 1C:
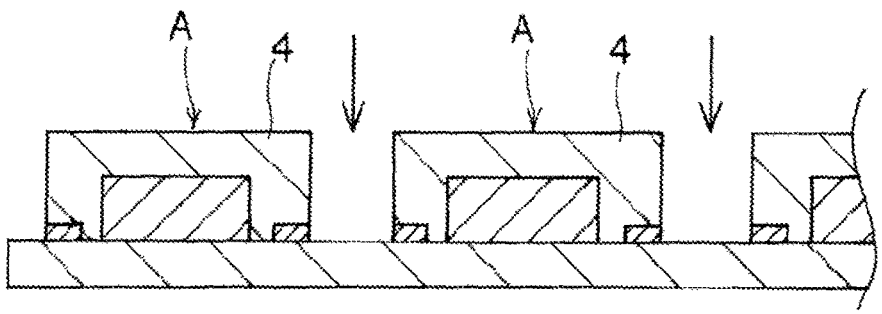

Subsequently, as illustrated with an arrow in FIG. 1(c), the sealing material 4 is cut away between the plurality of electronic parts 2 to form a groove portion, and each of packages of the electronic parts on the substrate 1 is individualized due to the groove portion. Reference sign A represents each of individualized packages. At least a portion of the ground circuit is exposed from a wall surface constituting the groove, and a bottom portion of the groove does not completely penetrate the substrate.

On the other hand, a predetermined amount of the above-described binder component, the silver-coated copper alloy particles, and the curing agent is mixed with the solvent and the modifying agent used depending on the necessity to prepare a conductive coating material.

Subsequently, the conductive coating material is sprayed in a mist form with a known spray gun and the like, and thoroughly applied such that the surface of a package and the ground circuit exposed from a wall surface are covered with the conductive coating material. A spray pressure or spray flow rate, and a distance between a spray port of the spray gun and the surface of the package at this time can be appropriately set depending on the necessity.

Figure 1D:
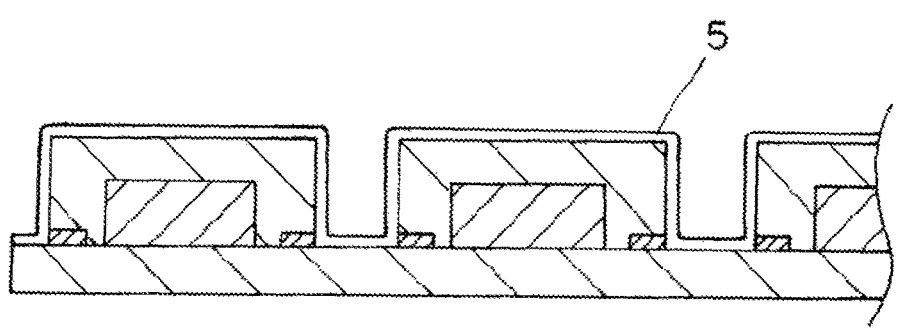
Figure 2:
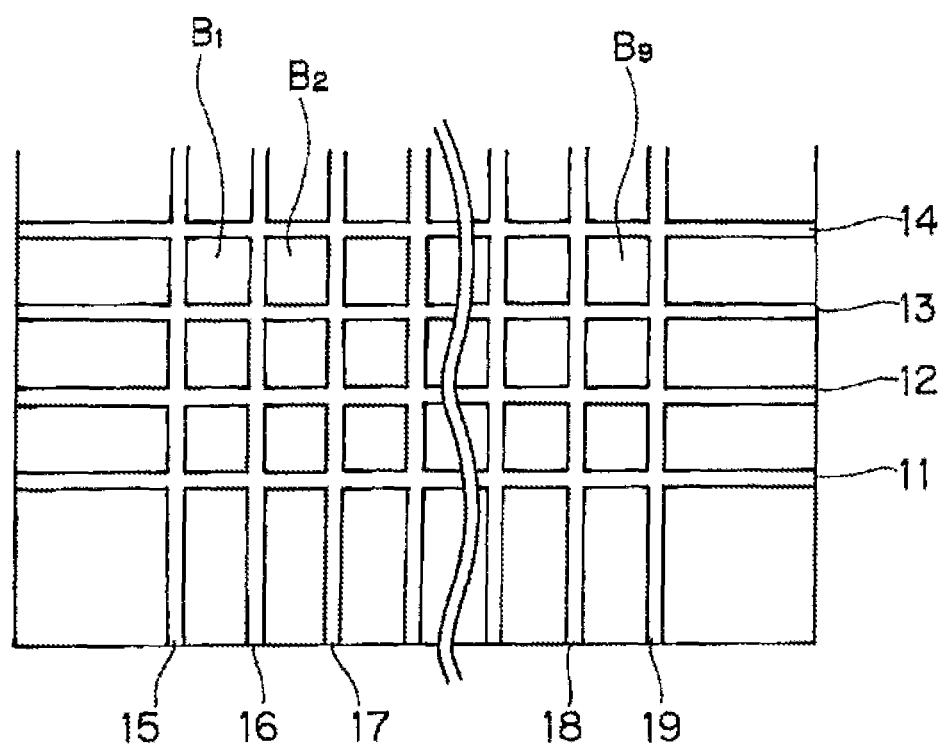
FIG. 2 is a plan view illustrating an example of a shielded package before individualization.

Subsequently, after heating the package to which the conductive coating material is applied and the solvent is sufficiently dried off, a shield layer 5 (conductive coating film) is formed on the surface of the package as illustrated in FIG. 1(d) by performing further heating and sufficiently curing the (meth)acrylate compound and the epoxy resin in the conductive coating material. Heating conditions at this time can be appropriately set. FIG. 2 is a plan view illustrating the substrate in this state. Reference signs $B_1$, $B_2$, . . . $B_9$ illustrate a shielded package before fragmentation, respectively, and reference signs 11 to 19 represent a groove between these shielded packages, respectively.

Figure 1E:
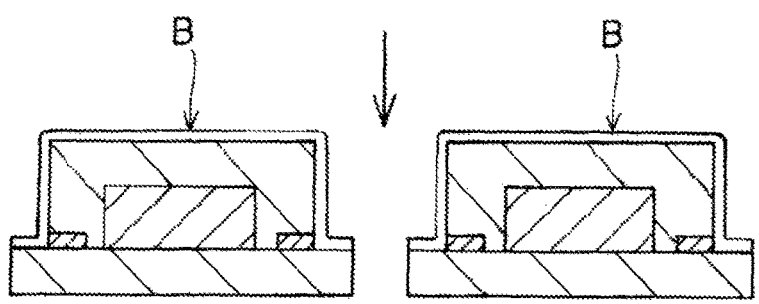

Subsequently, as illustrated with the arrow in FIG. 1(e), by cutting the substrate with a dicing saw and the like along a bottom portion of a groove between packages, a fragmented package B is obtained.

In the fragmented package B obtained in such a manner, a uniform shield layer is formed on the surface of the package (any of an upper surface portion, a side surface portion, and corner portions of a boundary between the upper surface portion and the side surface portion), and thus favorable shielding properties are obtained. In addition, since adhesion between the shield layer and the surface of the package and the ground circuit is excellent, it is possible to prevent the shield layer from being exfoliated from the surface of the package or the ground circuit due to impact at the time of fragmenting the package with a dicing saw and the like.

EXAMPLES

Hereinafter, the content of the present invention will be described in detail based on examples, but the present invention is not limited to the following. In addition, hereinafter, "part" or "%" is based on mass unless particularly mentioned.

1. Preparation and Evaluation of Conductive Coating Material

Examples, Comparative Examples

A curing agent, a solvent, and metal powders were mixed at a ratio described in Table 1 with respect to 100 parts by mass of a binder component containing an epoxy resin to obtain a conductive coating material. The details of each of the used components are as follows.

Solid epoxy resin: manufactured by Mitsubishi Chemical Corporation, product name "JER157S70"

As liquid epoxy resins,

Glycidyl amine type epoxy resin, manufactured by ADEKA Corporation, product name "EP-3905S"

Glycidyl ether type epoxy resin, manufactured by ADEKA Corporation, product name "EP-4400"

(Meth)acrylate resin: 2-hydroxy-3-acryloyloxypropyl methacrylate, manufactured by Kyoeisha Chemical Co., Ltd., product name "Light Ester G-201P"

Curing agent: 15 parts by mass of phenol novolac (manufactured by Arakawa Chemical Industries, Ltd., product name "Tamanol 758") and 5 parts by mass of 2-methyl imidazole (manufactured by Shikoku Chemicals Corporation, product name "2MZ-H")

Solvent: methyl ethyl ketone (MEK)

Metal powders: silver-coated copper alloy particles (average particle diameter of 5 μm, flake shape, aspect ratio of 2 to 10, alloy proportion is shown in table).

Measurement of the viscosity of the conductive coating material (liquid temperature of 25° C.) obtained in the above-described examples and comparative examples was performed with a BH viscometer or a cone-plate rotary viscometer. The measurement with the BH viscometer was performed at 10 rpm using rotor No. 5. The measurement with the cone-plate rotary viscometer was performed at 0.5 rpm using a programmable viscometer "DV-II+Pro" and a cone spindle CP40 of Brookfield Engineering. The measured viscosities are shown in Table 1. The signs "-" in the columns of viscosity show that the viscosity was not measurable with the viscometer.

The conductive coating materials of the examples and the comparative examples were evaluated as follows. The results are shown in Table 1.

(1) Conductivity of Conductive Coating Film

The conductivity of the conductive coating film obtained with the conductive coating material of Example 1 was evaluated in terms of specific resistivity. The measurement of the specific resistivity was performed as follows. A polyimide film having a thickness of 55 μm in which a slit having a width of 5 mm was provided was attached to a glass epoxy substrate to form a printing plate. The conductive coating material obtained in each of the examples and the comparative examples was subjected to line printing (a length of 60 mm, a width of 5 mm, a thickness of approximately 100 μm), pre-heated at 80° C. for 60 minutes, and then finally cured by heating at 160° C. for 60 minutes, and then the polyimide film was removed.

For the cured product sample, the specific resistivity was measured on both ends using a tester, and the specific resistivity (Ω·cm) was calculated by the following Equation (1) from the sectional surface area (S, cm²) and the length (L, cm).

$$\text{Specific resistivity} = S/L \times R \quad (1)$$

Regarding the sectional surface area, the length, and the specific resistivity of the sample, five lines were printed on each of three glass epoxy substrates, so that 15 lines were printed in total, and the average value thereof was obtained. A specific resistivity of $2 \times 10^{-4}$ Ω·cm or less indicates that the conductive coating material is advantageously usable for a shield layer.

In addition, regarding other examples and comparative examples, the specific resistivity was measured in the same manner. The results are shown in Table 1. From Table 1, it is apparent that the specific resistivity is $2 \times 10^{-4}$ Ω·cm or less in each example, and thus it was found that the conductive coating material was advantageously usable for the shield layer.

(2) Adhesion of Conductive Coating Material (Measurement of Shear Strength Before and after Solder Dip)

For evaluation of adhesion between the shield layer and the surface of the package or the ground circuit, a shear strength is measured based on JIS K 6850: 1999. Specifically, the conductive coating material was applied to an area of a length of 12.5 mm of a copper plate of width 25 mm×length 100 mm×thickness 1.6 mm. After the solvent was dried off at normal temperature for 5 minutes, a copper plate of width 25 mm×length 100 mm×thickness 1.6 mm was attached thereto. Subsequently, the copper plates were bonded by heating at 80° C. for 60 minutes and further heating at 160° C. for 60 minutes. Subsequently, the bonded surfaces were pulled in parallel using a tensile strength tester (manufactured by Shimadzu Corporation, product name "Autograph AGS-X"), and the maximum load at the time of breaking is divided by the adhesion area to calculate the shear strength. A shear strength of 3.0 MPa or greater indicates that the material is usable without any problem. In each example, the shear strength was 3.0 MPa or greater, and it was found that material was advantageously usable for a shield layer.

In addition to the above, adhesion after solder dip was evaluated. A package is exposed to a high temperature in the solder dip process. For this reason, adhesion between a shield layer and the surface of the package or the ground circuit after exposure to the high temperature is also important. Thus, for measurement of adhesion after solder dip, the conductive coating material was applied to the copper plate, the plates were bonded and heated at 80° C. for 60 minutes, and then the conductive coating material was cured by heating at 160° C. for 60 minutes, as described above. Subsequently, the shear strength after floating in a solder at 260° C. for 30 seconds was measured. The method for measuring the shear strength is as described above.

A shear strength of 3.0 MPa or greater after solder dip indicates that the material is usable for a shield layer without any problem. In each example, the shear strength of the conductive coating material after solder dip was 3.0 MPa or greater, and it was found that the material was advantageously usable for a shield layer.

(3) Measurement of Color Tone Change Before and after Heating of Conductive Coating Film The color tone of the coating film after heating and curing of conductive coating materials according to the present invention was evaluated. Specifically, a conductive coating material was applied to a glass plate and cured by heating at 150° C. for 60 minutes to form a cured coating film having a thickness of 20 μm. The color of the obtained cured coating film (hue H, value V, and chroma C) was examined based on JIS Z 8721 (1993). Subsequently, the cured coating film was further heated at 200° C. for 60 minutes, and the color of the cured coating film was examined in the same manner as described above. It was confirmed beforehand that the color of the cured coating film after further heating at 200° C. for 60 minutes was almost the same as the color of the cured coating film after a heat cycle test (200 cycles of −65° C. for 30 minutes and 150° C. for 30 minutes). Changes in the color were evaluated based on the following criteria.

Acceptable: Chroma C does not change or changes only by 1 stage (for example, change from C2 to C3), and any other type of change (changes in hue H or value V) are not observed.

Unacceptable: One of hue H or value V changes, or chroma C changes by 2 stages or greater. The results are shown in Table 1.

As shown in Table 1, discoloration after heating and curing was suppressed in each example, but in all of Comparative Examples 1 to 4, change in value V by two stages was observed and the appearance was significantly deteriorated.

2. Evaluation of Shield Layer on Package Surface

A glass epoxy substrate having 10 grooves formed with a width of 1 mm and a depth of 2 mm by counter sinking in each of lateral and vertical rows and also having 9 islands formed as simulated 1 cm-square packages in each of lateral and vertical rows was used as a model for a package before fragmentation. The conductive coating material obtained in each of the examples and comparative examples was sprayed on the surface of the package using a commercially available spray gun (manufactured by Anest Iwata Corporation, "LPH-101A-144LVG" (product name)) under the conditions described below, and then allowed to stand at 25° C. for 30 minutes so that the solvent was vaporized. Subsequently, the conductive coating material was heated at 80° C. for 60 minutes and cured by further heating at 160° C. for 60 minutes.

<Spray Condition>

Application amount: application at a flow rate of 200 L/minute for nine seconds

Supply pressure: 0.5 MPa

Package surface temperature: 25° C.

Figure 3A:
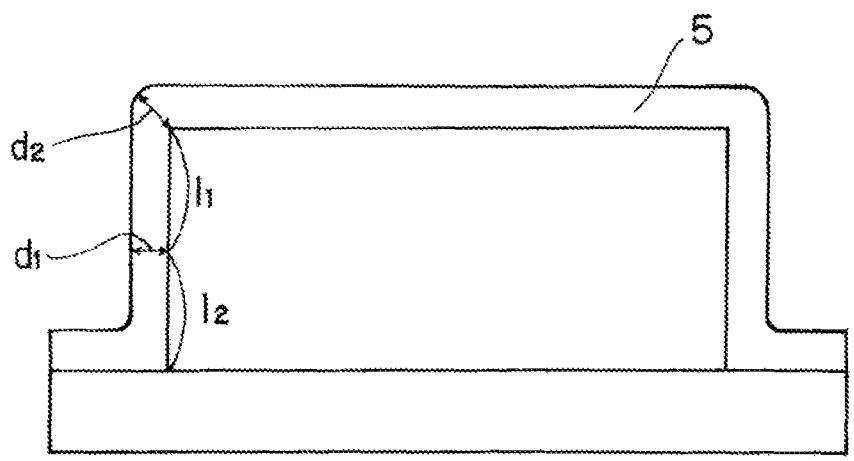
FIGS. 3(a) and 3(b) are perspective sectional views of a shielded package for explaining a method for evaluation of coating film uniformity.
Figure 3B:
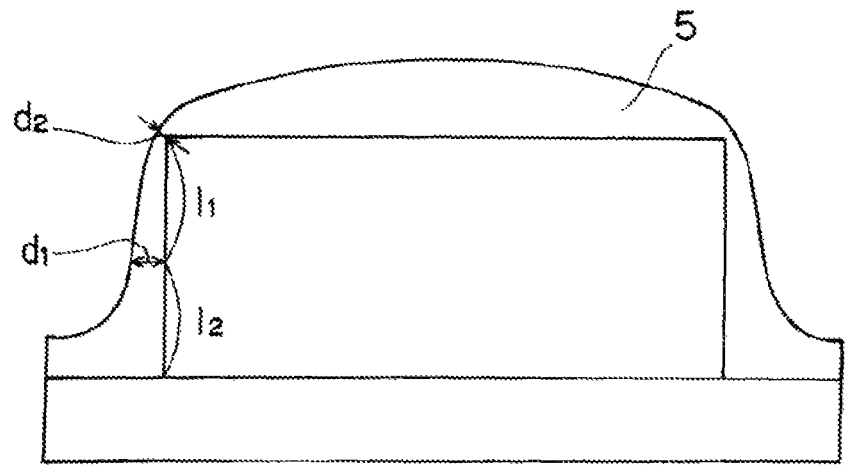

Distance from package surface to nozzle: approximately 20 cm (1) Uniformity of thickness of shield layer The thickness of the shield layer was calculated from the difference between the thicknesses of the shield layer at corner and wall-surface portions in a cross-section of the package with the shield layer formed. Specifically, as illustrated in FIGS. 3(a) and 3(b), the thickness of the shield layer formed on a side surface of the package was denoted by $d_1$ (here, $d_1$ is measured at a center portion in the height direction of the side surface, provided that the distance $1_1$ from the upper surface to the measurement position and the distance $1_2$ from the bottom surface to the measurement position are equal to each other), the thickness (measured at an angle of 45° upward from the horizontal surface) of the shield layer formed at a corner portion of the package was denoted by d2, and the proportion (%) calculated by the following equation was used as an index of uniformity. A proportion of 60% or less indicates that the material is advantageously usable for a shield layer, and thus is denoted by "good".

$$\text{Proportion (\%)} = ((d_1 - d_2)/d_1) \times 100$$

As the difference between the thicknesses of the shield layer becomes close to zero, the thickness of the shield layer becomes uniform. However, if a conventional conductive coating material is used to form a shield layer at a corner portion, the shield layer will have an increased thickness at a wall surface portion and thus vary in resistance value. On the other hand, if the thickness at the wall surface portion is made thinly, the shield layer may fail to be formed at the corner portion so that the shielding effect may be lost. In each example, the proportion of the difference between the thicknesses of the shield layer at the corner and wall surface portions was 60% or less, and it was found that the material was advantageously usable for a shield layer.

(2) Conductivity of Shield Layer

The conductivity of the shield layer was measured in terms of resistance value. Specifically, any one row was selected from the rows including the cubic islands formed by the counter sinking, and the resistance value between the islands at both ends of the row (between $B_1$ and $B_9$ in FIG. 2) was measured. A resistance value of 100 mΩ or less indicates that the material is advantageously usable for a shield layer, and thus is denoted by "good".

TABLE 1

| | | Example | | | | | | | | | | | | | Comparative Example | | | | | | |
|---|---|---|---|---|---|---|---|---|---|---|---|---|---|---|---|---|---|---|---|---|---|
| Item | | 1 | 2 | 3 | 4 | 5 | 6 | 7 | 8 | 9 | 10 | 11 | 12 | 1 | 2 | 3 | 4 | 5 | 6 | 7 |
| Solid epoxy resin (parts by mass) | | 20 | 20 | 20 | 20 | 15 | 15 | 15 | 15 | 15 | 15 | 15 | 20 | 15 | 20 | 20 | 15 | 20 | 0 | 20 |
| Liquid epoxy resin (parts by mass) | | 80 | 80 | 80 | 80 | 35 | 35 | 35 | 35 | 35 | 50 | 60 | 80 | 35 | 80 | 80 | 35 | 80 | 35 | 80 |
| Glycidyl amine type epoxy resin | | 30 | 30 | 30 | 30 | 10 | 10 | 10 | 10 | 10 | 10 | 10 | 30 | 10 | 30 | 30 | 10 | 30 | 10 | 30 |
| Glycidyl ether type epoxy resin | | 50 | 50 | 50 | 50 | 25 | 25 | 25 | 25 | 25 | 40 | 50 | 50 | 25 | 50 | 50 | 25 | 50 | 25 | 50 |
| (Meth)acrylate compound (parts by mass) | | 0 | 0 | 0 | 0 | 50 | 50 | 50 | 50 | 50 | 35 | 25 | 0 | 50 | 0 | 0 | 50 | 0 | 65 | 0 |
| Curing agent (parts by mass) | | 20 | 20 | 20 | 20 | 20 | 20 | 20 | 20 | 20 | 20 | 20 | 20 | 20 | 20 | 20 | 20 | 20 | 20 | 20 |
| Solvent (MEK) (parts by mass) | | 110 | 110 | 550 | 110 | 110 | 110 | 110 | 290 | 300 | 110 | 110 | 110 | 110 | 110 | 110 | 110 | 110 | 650 | 110 |
| Metal powder | Content (parts by mass) | 1000 | 1000 | 1200 | 1000 | 1000 | 1000 | 1000 | 1750 | | 1000 | 1000 | 1000 | 1000 | 1000 | 1000 | 1000 | 1000 | 1000 | 1000 |
| | Ni content (% by mass) | 5 | 5 | 5 | 5 | 5 | 5 | 15 | 5 | 5 | 5 | 5 | 5 | 0 | 0 | 0 | 0.3 | 5 | 5 | 25 |
| | Zn content (% by mass) | 10 | 5 | 5 | 15 | 10 | 5 | 15 | 10 | 10 | 10 | 10 | 10 | 0 | 85 | 80 | 0.5 | 25 | 10 | 10 |
| | Cu content (% by mass) | 75 | 80 | 80 | 60 | 75 | 80 | 60 | 75 | 75 | 75 | 75 | 75 | 90 | 5 | 10 | 89 | 60 | 75 | 55 |
| | Ag content (% by mass) | 10 | 10 | 10 | 10 | 10 | 10 | 10 | 10 | 10 | 10 | 10 | 10 | 10 | 10 | 10 | 10 | 10 | 10 | 10 |
| Cone-plate rotary viscometer CP40 0.5 rpm (mPa · S) | | — | — | 126 | — | — | — | — | — | — | — | — | — | — | — | — | — | — | 80 | — |
| Single cylindrical rotary viscometer Rotor No. 5 10 rpm (dPa · S) | | 27 | 27 | — | 26 | 13 | 22 | 20 | 28 | 17 | 20 | 27 | 28 | 14 | 38 | 23 | 16 | 20 | — | 21 |
| Conductivity of conductive coating film (specific resistivity, ×10⁻⁵ Ω · cm) | | 15 | 13 | 13 | 19 | 12 | 8 | 18 | 9 | 12 | 12 | 16 | 20 | 8 | 20 | 15 | 11 | 40 | 17 | 48 |
| Adhesion of conductive coating film (shear strength, MPa) | Before solder dip | 7 | 7.2 | 4.2 | 7.1 | 7.3 | 4.2 | 4.3 | 4.1 | 8.1 | 7.1 | 7.1 | 7.3 | 7.1 | 4.5 | 4.2 | 7.3 | 4.2 | 2 | 4.3 |
| | After solder dip | 6.6 | 6.9 | 3.8 | 6.7 | 7.6 | 4.3 | 3.9 | 4.3 | 8.3 | 8 | 7.2 | 6 | 7.3 | 4.1 | 4.1 | 7 | 4.2 | 1.5 | 4.3 |
| Discoloration test of conductive coating film | After curing at 150° C. for 60 minutes | 10 YR 8/2 | 10 YR 8/2 | 10 YR 8/2 | 10 YR 8/2 | 10 YR 8/2 | 10 YR 8/2 | 10 YR 8/2 | 10 YR 8/2 | 10 YR 8/2 | 10 YR 8/2 | 10 YR 8/2 | 10 YR 8/2 | 5 YR 8/2 | 5 YR 8/1 | 5 YR 8/1 | 5 YR 8/2 | 10 YR 8/2 | 10 YR 8/2 | 10 YR 8/2 |
| | After curing at 150° C. for 60 minutes + after curing at 200° C. for 60 minutes | 10 YR 8/3 | 10 YR 8/3 | 10 YR 8/3 | 10 YR 8/3 | 10 YR 8/3 | 10 YR 8/3 | 10 YR 8/3 | 10 YR 8/3 | 10 YR 8/3 | 10 YR 8/3 | 10 YR 8/3 | 10 YR 8/3 | 5 YR 6/3 | 5 YR 6/2 | 5 YR 6/2 | 5 YR 6/2 | 10 YR 8/3 | 10 YR 8/3 | 10 YR 8/3 |
| | Evaluation of discoloration | good | good | good | good | good | good | good | good | good | good | good | good | bad | bad | bad | good | bad | good | good |
| Spray test on surface of package | Uniformity of thickness of shield layer | good | good | good | good | good | good | good | good | good | good | good | good | good | good | good | good | good | bad | good |
| | Conductivity of shield layer | good | good | good | good | good | good | good | good | good | good | good | good | good | good | good | good | bad | bad | bad |

From the results shown in Table 1, it was found that all coating films each obtained with the conductive coating material of each example had not only favorable shielding properties but also favorable adhesion, and were less likely to be discolored under severe heating conditions.

The present international application claims priority based on Japanese Patent Application No. 2016-065470 which is a Japanese patent application filed on Mar. 29, 2016, and the entire content of Japanese Patent Application No. 2016-065470 which is the Japanese patent application is employed in the present international application.

The description of the specific embodiments of the present invention is presented as examples. The described embodiments themselves are not intended to be exhaustive or to limit the present invention. It is obvious for those skilled in the art that various modifications or changes are possible in view of the above described content.

The invention claimed is:

1. A conductive coating material comprising at least:
   (A) 100 parts by mass of a binder component including 5 to 30 parts by mass of a solid epoxy resin that is a solid at normal temperature and 20 to 90 parts by mass of a liquid epoxy resin that is a liquid at normal temperature, provided that the total amount of the solid and liquid epoxy resins does not exceed 100 parts by mass;
   (B) 200 to 1800 parts by mass of silver-coated copper alloy particles which are copper alloy particles covered with a silver-containing layer, in which the copper alloy particles are made of an alloy of copper, nickel, and zinc, the silver-coated copper alloy particles have a nickel content of 0.5% to 20% by mass, and the silver-coated copper alloy particles have a zinc content of 1% to 20% by mass with respect to 100 parts by mass of the binder component (A); and
   (C) 0.3 to 40 parts by mass of a curing agent with respect to 100 parts by mass of the binder component (A).

2. The conductive coating material according to claim 1, wherein the liquid epoxy resin comprises 5 to 35 parts by mass of a liquid glycidyl amine type epoxy resin and 20 to 55 parts by mass of a liquid glycidyl ether type epoxy resin.

3. The conductive coating material according to claim 2, wherein the liquid glycidyl amine type epoxy resin has a weight per epoxy equivalent of 80 to 120 g/eq and a viscosity of 1.5 Pa·s or less, and the liquid glycidyl ether type epoxy resin has a weight per epoxy equivalent of 180 to 220 g/eq and a viscosity of 6 Pa·s or less.

4. The conductive coating material according to claim 1, wherein the binder component (A) further contains a (meth)acrylate compound.

5. The conductive coating material according to claim 2, wherein the binder component (A) further contains a (meth)acrylate compound.

6. The conductive coating material according to claim 3, wherein the binder component (A) further contains a (meth)acrylate compound.

7. The conductive coating material according to claim 1, wherein the silver-coated copper alloy particles (B) is flake shape.

8. The conductive coating material according to claim 2, wherein the silver-coated copper alloy particles (B) is flake shape.

9. The conductive coating material according to claim 3, wherein the silver-coated copper alloy particles (B) is flake shape.

10. The conductive coating material according to claim 4, wherein the silver-coated copper alloy particles (B) is flake shape.

11. The conductive coating material according to claim 1, which is for use in shielding an electronic part package.

12. A method for producing a shielded package in which electronic parts are mounted on a substrate, and a package obtained by sealing the electronic parts with a sealing material is covered with a shield layer, the method comprising at least:
    a step of mounting a plurality of electronic parts on the substrate and sealing the electronic parts by filling the substrate with a sealing material and curing thereof;
    a step of forming a groove portion by cutting away the sealing material between the plurality of electronic parts and individualizing the package of each electronic part on the substrate by the groove portion;
    a step of applying the conductive coating material according to claim 8 to a surface of the individualized package by spraying;
    a step of forming the shield layer by heating the package to which the conductive coating material is applied and curing the conductive coating material; and
    a step of obtaining a fragmented shielded package by cutting the substrate along the groove portion.

13. A method for producing a shielded package according to claim 12, wherein the liquid epoxy resin comprises 5 to 35 parts by mass of a liquid glycidyl amine type epoxy resin and 20 to 55 parts by mass of a liquid glycidyl ether type epoxy resin.

14. A method for producing a shielded package according to claim 12, wherein the liquid glycidyl amine type epoxy resin has a weight per epoxy equivalent of 80 to 120 g/eq and a viscosity of 1.5 Pa·s or less, and the liquid glycidyl ether type epoxy resin has a weight per epoxy equivalent of 180 to 220 g/eq and a viscosity of 6 Pa·s or less.

15. A method for producing a shielded package according to claim 12, wherein the binder component (A) further contains a (meth)acrylate compound.

16. A method for producing a shielded package according to claim 12, wherein the silver-coated copper alloy particles (B) is flake shape.

* * * * *